US008520438B2

(12) United States Patent
Seo et al.

(10) Patent No.: US 8,520,438 B2
(45) Date of Patent: Aug. 27, 2013

(54) PROGRAM METHOD OF NONVOLATILE MEMORY DEVICE (75) Inventors: Ji-Hyun Seo, Gyeonggi-do (KR); Byong-Kook Kim, Gyeonggi-do (KR); Sung-Jae Chung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 112 days.

(21) Appl. No.: 13/238,731

(22) Filed: Sep. 21, 2011

(65) Prior Publication Data
US 2012/0294087 A1 Nov. 22, 2012

(30) Foreign Application Priority Data

May 20, 2011 (KR) ........................ 10-2011-0047965

(51) Int. Cl.
*G11C 11/34* (2006.01)
(52) U.S. Cl.
USPC ................................ 365/185.18; 365/185.17
(58) Field of Classification Search
USPC ........................................ 365/185.18, 185.17
See application file for complete search history.

(56) References Cited

U.S. PATENT DOCUMENTS 7,463,522 B2 * 12/2008 Dong et al. .............. 365/185.17

FOREIGN PATENT DOCUMENTS

| JP | 2005-243152 | 9/2005 |
| KR | 1020050029704 | 3/2005 |
| KR | 1020100029515 | 3/2010 |

OTHER PUBLICATIONS

Notice of Allowance issued by the Korean Intellectual Property Office on Apr. 17, 2013.

* cited by examiner

*Primary Examiner* — Son Dinh
*Assistant Examiner* — Nam Nguyen
(74) *Attorney, Agent, or Firm* — IP & T Group LLP

(57) ABSTRACT

A program method of a nonvolatile memory device includes applying a program voltage to a selected word line, applying a first pass voltage to at least one word line adjacent to the selected word line, applying at least one first middle voltage lower than the first pass voltage but higher than an isolation voltage to at least one word line adjacent to the word line receiving the first pass voltage, applying the isolation voltage to a word line adjacent to the word line receiving the first middle voltage, applying at least one second middle voltage higher than the isolation voltage but lower than a second pass voltage to at least one word line adjacent to the word line receiving the isolation voltage, and applying a second pass voltage to at least one word line adjacent to the word line receiving the second middle voltage.

20 Claims, 6 Drawing Sheets

PROGRAM METHOD OF NONVOLATILE MEMORY DEVICE

CROSS-REFERENCE TO RELATED APPLICATIONS

The present application claims priority of Korean Patent Application No. 10-2011-0047965, filed on May 20, 2011, which is incorporated herein by reference in its entirety.

BACKGROUND

1. Field

Exemplary embodiments of the present invention relate to a program method of a nonvolatile memory device, and more particularly, to a program method of a nonvolatile memory device which performs a program inhibit operation using a local self-boosting scheme.

2. Description of the Related Art

A nonvolatile memory device is capable of electrically programming and erasing data and does not require a refresh function for rewriting data periodically. Here, programming refers to an operation of writing data into a memory cell.

In a NAND-type flash memory device, which is an exemplary nonvolatile memory device, adjacent memory cells share a drain or source such that a plurality of memory cells are coupled in series to form a cell string (that is, a memory cell string). NAND-type flash memory devices are suitable for storing a large amount of information.

Each of cell strings of a NAND-type flash memory device may include a drain selection transistor, memory cells, and a source selection transistor, which are coupled in series between a bit line and a common source line. The drain selection transistors, the memory cells, and the source selection transistors in different cell strings have their gates coupled to one another by a drain selection line, word lines, and a source selection line, respectively, where they are controlled by the drain selection line, the word lines, and the source selection line, respectively. Here, memory cells having control gates commonly coupled to a word line are controlled by the word line and form a page. On a larger scale, the plurality of cell strings that includes pages and a plurality of bit lines coupled to the cell strings form a memory cell block.

In programming memory cells, an erase operation may be first performed on memory cells to adjust their threshold voltages to a negative voltage. Subsequently, when a high voltage is applied as a program voltage to a word line of a selected memory cell the threshold voltage of the selected memory cell increases. On the other hand, the threshold voltages of the remaining memory cells are not changed.

However, in applying the program voltage to the selected word line during the program operation, the program voltage is applied to all memory cells sharing the selected word line. Accordingly, memory cells coupled to the selected word line other than the selected memory cell may be programmed (that is, a program disturbance).

As to methods for preventing such a program disturbance, a program inhibit method using a self-boosting scheme and a program inhibit method using a local self-boosting scheme are available.

In the self-boosting scheme, all memory cells of a cell string coupled to an unselected bit line are electrically isolated by turning off a source/drain selection transistor and enter a floating state while the memory cell channels are coupled in series. Here, a channel voltage is boosted. Since a voltage difference between the boosted channel voltage and a word line is small, a program inhibit cell (that is, a memory cell not to be programmed) coupled to the unselected bit line may be prevented from being programmed even though a program voltage is applied to a selected word line.

The local self-boosting scheme is similar to the self-boosting scheme but differs in the following features. In the local self-boosting scheme, as a memory cell positioned in one side or both sides of a selected memory cell among memory cells of a cell string coupled to an unselected bit line is turned off, memory cell channels of the cell string coupled to the unselected bit line are electrically separated into two or more local channels (that is, a channel to which the selected memory cell belongs and the other channels) that are isolated from each other and enter a floating state. Here, the channel voltages of the respective local channels are boosted. In the local self-boosting scheme, the boosting effect of the channel voltage of the program inhibit cell may be strengthened as compared with the self-boosting scheme.

However, when the local self-boosting scheme is applied, a difference between the boosted local channel voltage and a channel voltage of a turned-off memory cell may be large and thus cause hot carrier injection, where leakage current in the turned-off memory cell contributes to injection of electrons in an adjacent memory cell such as a program inhibit cell.

Here, the above-described hot carrier injection may degrade device characteristics by, for example, varying the threshold voltage of a memory cell, causing an error in a program operation or read operation, etc. Therefore, a technology for preventing the above-described hot carrier injection is useful.

SUMMARY

An exemplary embodiment of the present invention is directed to a program method of a nonvolatile memory device which is capable of reducing hot carrier injection caused by a channel voltage difference between memory cells, while performing a program inhibition operation according to a local self-boosting scheme.

In accordance with an exemplary embodiment of the present invention, a program method of a nonvolatile memory device including a memory cell array with a plurality of word lines between a drain selection line and a source selection line includes: applying a program voltage to a selected word line; applying a first pass voltage to at least one word line adjacent to the selected word line; applying at least one first middle voltage lower than the first pass voltage but higher than an isolation voltage to at least one word line adjacent to the word line receiving the first pass voltage; applying the isolation voltage to a word line adjacent to the word line receiving the first middle voltage; applying at least one second middle voltage higher than the isolation voltage but lower than a second pass voltage to at least one word line adjacent to the word line receiving the isolation voltage; and applying a second pass voltage to at least one word line adjacent to the word line receiving the second middle voltage.

In accordance with another exemplary embodiment of the present invention, a program method of a nonvolatile memory device including a plurality of cell strings that each have a plurality of memory cells coupled in series between a drain selection transistor and a source selection transistor includes: applying a program voltage to a control gate of a memory cell of a first cell string; applying a first pass voltage to a control gate of at least one memory cell adjacent to the memory cell receiving the program voltage, wherein the first pass voltage turns on the at least one memory cell adjacent to the memory cell receiving the program voltage; applying at least one first middle voltage lower than the first pass voltage but higher than an isolation voltage to a control gate of at least one memory cell adjacent to the memory cell receiving the first pass voltage; applying the isolation voltage to a control gate of at least one memory cell adjacent to the memory cell receiving the first middle voltage, wherein the isolation voltage turns on the at least one memory cell adjacent to the memory cell receiving the first middle voltage; applying at least one second middle voltage higher than the isolation voltage but lower than a second pass voltage to a control gate of at least one memory cell adjacent to the memory cell receiving the isolation voltage; and applying the second pass voltage to a control gate of at least one memory cell adjacent to the memory cell receiving the second middle voltage.

In accordance with yet another exemplary embodiment of the present invention, a method of a nonvolatile memory device includes: applying a program voltage to a selected word line for a memory string; applying an isolation voltage to another word line for the memory string, wherein a memory cell of the memory string receives the isolation voltage and is turned off in response to the isolation voltage regardless of whether the memory cell is programmed; applying at least one first pass voltage to at least one first word line located between the selected word line and the word line receiving the isolation voltage, wherein at least one memory cell of the memory string receives the at least one first pass voltage and is turned on in response to the at least one first pass voltage regardless of whether the at least one memory cell receiving the at least one first pass voltage is programmed; and applying at least one middle voltage to at least one second word line located between the at least one first word line and the word line receiving the isolation voltage, wherein the at least one middle voltage is lower than the at least one first pass voltage but higher than the isolation voltage.

BRIEF DESCRIPTION OF THE DRAWINGS

The patent or application file contains at least one drawing executed in color. Copies of this patent or patent application publication with drawings will be provided by the Office upon request and payment of the necessary fee.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1A:
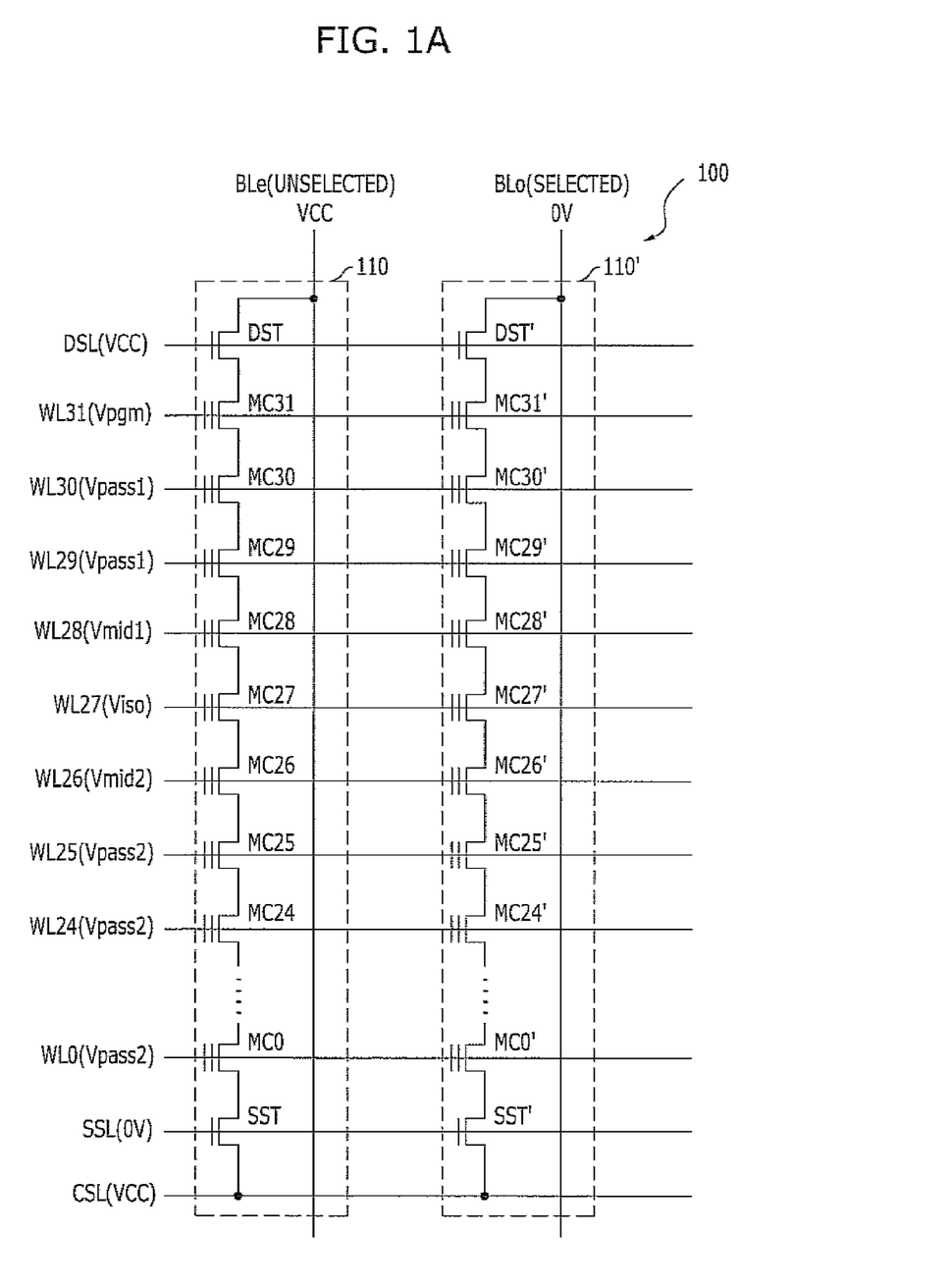
FIG. 1A is a circuit diagram illustrating a nonvolatile memory device and a program method thereof in accordance with a first exemplary embodiment of the present invention.
Figure 1B:
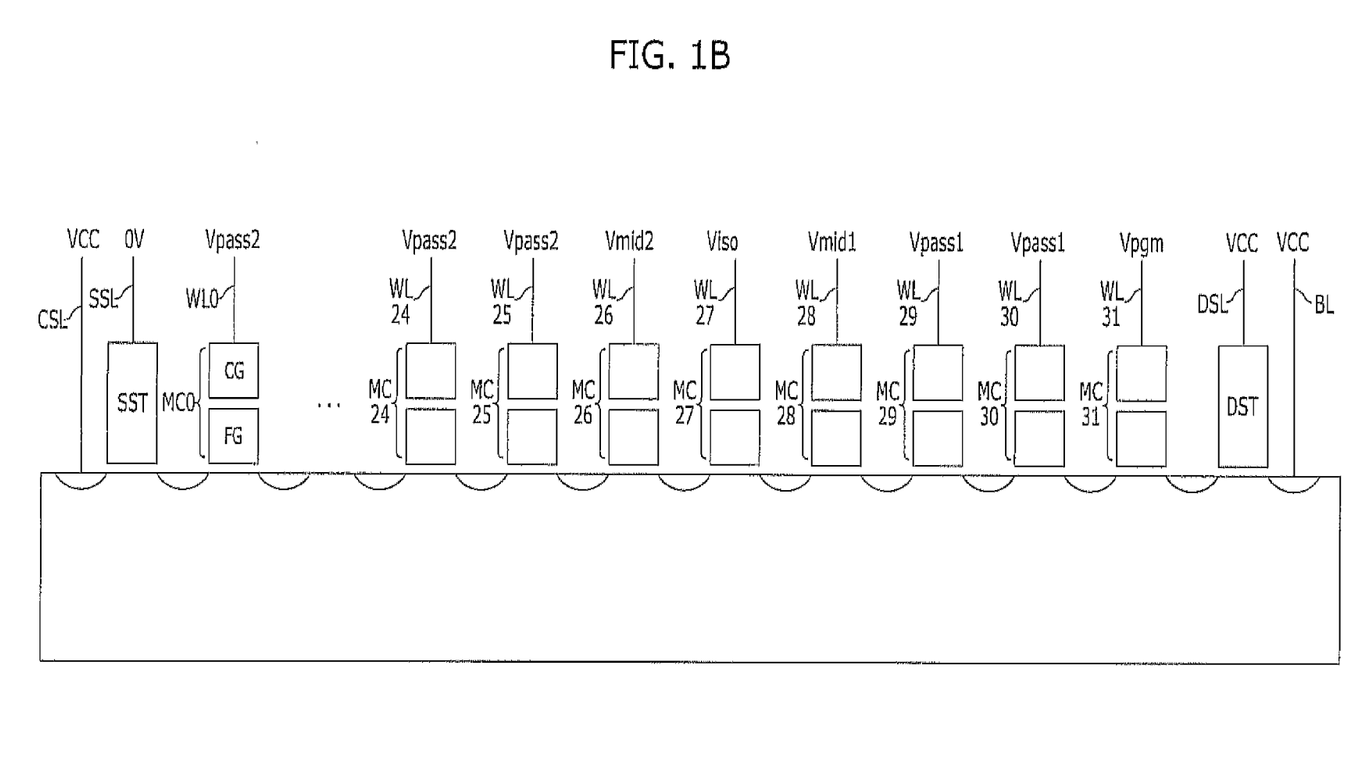
FIG. 1B is a cross-sectional view of a cell string coupled to an unselected bit line of FIG. 1A.

FIG. 1A is a circuit diagram illustrating a nonvolatile memory device and a program method thereof in accordance with a first exemplary embodiment of the present invention. FIG. 1B is a cross-sectional view of a cell string coupled to an unselected bit line of FIG. 1A.

Referring to FIGS. 1A and 1B, the nonvolatile memory device in accordance with the first exemplary embodiment of the present invention is provided with a memory cell block 100 including a plurality of cell strings 110 and 110', a plurality of bit lines BLe and BLo coupled to first ends of the cells strings 110 and 110', respectively, and a common source line CSL commonly coupled to the other ends of the cell strings 110 and 110'.

The cell strings 110 and 110' include memory cells (MC0 to MC31 and MC0' to MC31'), source selection transistors (SST and SST'), and drain selection transistors (DST and DST'), respectively. The memory cells (MC0 to MC31 or MC0' to MC31') are coupled in series between the source selection transistor (SST or SST') and the drain selection transistor (DST or DST'). In this exemplary embodiment, while the memory cell block 100 are shown to include two cell strings 110 and 110', the number of cell strings may be changed according to different environments in which the exemplary embodiment is applied.

Each of the memory cells (MC0 to MC31 and MC0' to MC31') includes a stacked structure of a floating gate FG and a control gate CG, and control gates of the memory cells are coupled to each other to share a word line. For example, memory cells MC31 and MC31' share a word line WL31 and form a page. While 32 pages and 32 word lines WL0 to WL31 are shown, the number of word lines may be changed according to different embodiments in which the exemplary embodiment is applied.

Further, the gates of drain selection transistors DST and DST' are commonly coupled to a drain selection line DSL, and the gates of source selection transistors SST and SST' are commonly coupled to a source selection line SSL.

Therefore, the plurality of word lines WL0 to WL31 arranged in parallel to each other are provided between selection transistors controlled by the drain selection line DSL and the source selection line SSL of the memory cell block 100.

The plurality of bit lines BLe and BLo may be coupled to drains of the drain selection transistors DST and DST' included in the cell strings 110 and 110', respectively, where BLe represents an even bit line, and BLo represents an odd bit line. According to an example, BLe is an unselected bit line and BLo is a selected bit line during a program operation. However, different bit lines may be selected or unselected according to different embodiments in which the exemplary embodiment is used.

The common source line CSL may be commonly coupled to sources of the source selection transistors SST and SST' included in the cell strings 110 and 110'.

A method for programming a nonvolatile memory device may be performed as follows. According to an example, a program inhibit method using the local self-boosting scheme may be performed as follows.

First, an erase operation is performed to erase data of all the memory cells (MC0 to MC31 and MC0' to MC31') included in the memory cell block 100.

Subsequently, a ground voltage 0V is applied to the source selection line SSL coupled to the gate of the source selection line SST, a power supply voltage VCC is applied as a program inhibit voltage to the unselected bit line BLe, a ground voltage 0V is applied to the selected bit line BLo, and a power supply voltage VCC is applied to the drain selection line DSL corresponding to the gate of the drain selection transistor DST. Accordingly, the channels of the cell strings 110 and 110' are precharged to the voltages applied to the unselected bit line BLe and the selected bit line BLo, respectively.

Here, the selected bit line BLo is coupled to the cell string 110' including a memory cell to program (hereinafter referred to as a program target memory cell), and the unselected bit line BLe is coupled to the cell string 110 including a memory cell which is not to be programmed but is coupled to the same word line that the program target memory cell (hereinafter, referred to as a program inhibit memory cell) is coupled to. According to an example, the program target memory cell is the memory cell MC31', which is the closest memory cell of the cell string 110' with respect to the selected bit line BLo and receives a program voltage Vpgm as described below, and the program inhibit memory cell is the memory cell MC31 of the cell sting 110. However, the positions of the program target memory cell and the program inhibit memory cell may be changed depending on different design needs/operations as shown in, for example, Fig.

Subsequently, a program voltage Vpgm is applied to the word line WL31 coupled to the control gate CG of the program target memory cell MC31 (that is, the selected word line WL31), and a first pass voltage Vpass1 lower than the program voltage Vpgm is applied to one or more word lines adjacent to the selected word line WL31, for example, the word lines WL30 and WL29. Further, a first middle voltage Vmid1 lower than the first pass voltage Vpass1 and higher than an isolation voltage Viso is applied to one or more word lines (for example, the word line WL28) adjacent to the word lines WL30 and 29 receiving the first pass voltage Vpass1, and the isolation voltage Viso is applied to one or more word lines (for example, the word line WL27) adjacent to the word line (WL28) receiving a first middle voltage Vmid1. Further, a second middle voltage Vmid2 higher than the isolation voltage Viso and lower than a second pass voltage Vpass2 is applied to one or more word lines (for example, the word line WL26) adjacent to the word line WL27 to which the isolation voltage Viso is applied, and the second pass voltage Vpass2 is applied to the other word lines (WL0 to WL25) adjacent to the word line WL26 receiving the second middle voltage Vmid2 is applied.

The program voltage Vpgm is a high voltage for programming the program target memory cell MC31' and may be set to about 20V, according to an example.

The first or second pass voltage Vpass1 or Vpass2 is a voltage for turning on the corresponding memory cells (MC0 to MC25, MC29, and MC30) of the cell string 110 coupled to the unselected bit line BLe regardless of their program states. The first or second pass voltage Vpass1 or Vpass2 has a value higher than the isolation voltage Viso but lower than the program voltage Vpgm and may be set to 9V, according to an example. The first pass voltage Vpass1 may be equal to or different from the second pass voltage Vpass2.

The isolation voltage Viso is a low voltage for turning off the memory cell MC27 of the cell string 110 regardless of its programmed state and may have a value of 3V, according to an example.

As the isolation voltage Viso is applied, the cell string 110 coupled to the unselected bit line BLe may include two or more local channels which are electrically isolated from each other and are in a floating state. More specifically, the channels of the cell string 110 may include a local channel that is configured as a channel for the memory cell MC31 receiving the program voltage Vpgm and the memory cells MC30 and MC29 which are adjacent to the memory cell MC31 and receive the first pass voltage Vpass1 and further include another local channel that is configured as a channel for the memory cells MC0 to MC25 receiving the second pass voltage Vpass2. Here, the local channels are electrically isolated from each other when the isolation voltage Viso is applied to the memory cell MC27 set at the center of the cell string 110.

Here, since the channel voltages of the memory cells MC29 to MC31 may be self-boosted in response to the program voltage Vpgm and the first pass voltage Vpass1, F-N tunneling does not occur between the floating gate FG of the program inhibit memory cell MC31 and the channel and the program inhibit memory cell MC31 maintains the initial erase state.

The first middle voltage Vmid1 is applied to the memory cell MC28 disposed between the memory cell MC27 receiving the isolation voltage Viso and the memory cell MC29 receiving the first pass voltage Vpass1 and has a value between the first pass voltage Vpass1 and the isolation voltage Viso. Further, the second middle voltage Vmid2 is applied to the memory cell MC26 disposed between the memory cell MC27 receiving the isolation voltage Viso and the memory cell MC25 receiving the second pass voltage Vpass2 and has a value between the second pass voltage Vpass2 and the isolation voltage Viso. Here, the first and second middle voltages Vmid1 and Vmid2 may have the same value (for example, 5.6V). When the first and second middle voltages Vmid1 and Vmid2 are equal to each other, the configuration of a voltage generation circuit for providing voltages including the two middle voltages may be more simplified than when the first and second middle voltages Vmid1 and Vmid2 are different from each other.

In a conventional nonvolatile memory device, a word line receiving an isolation voltage may be disposed between word lines receiving pass voltages and arranged adjacent to the word lines. For example, when the configuration is described with reference to FIGS. 1A and 1B, the first and second pass voltages Vpass1 and Vpass2 are applied to the word lines W26 and W28, respectively, at both sides of the word line WL27 to which the isolation voltage Viso is applied. Accordingly, the channels of the cell string 100 coupled to the unselected bit line BLe are isolated with the channel of the memory cell MC27 being at the center and include a local channel formed by a channel through the memory cells MC28 to MC31 and another local channel formed by a channel formed through the memory cells MC0 to MC26.

In accordance with the conventional nonvolatile memory device, the channel voltage of the memory cell MC27 is fixed to a low voltage (for example, the ground voltage 0V) by the isolation voltage Viso, and the local channel voltages at both sides of the channel of the memory cell MC27 are boosted by the program voltage Vpgm and/or the pass voltages Vpass1 and Vpass2. Here, a difference between the channel voltage of the turned-off memory cell MC27 and the voltage of the local channel through the adjacent memory cells MC26 or MC28 becomes relatively large. In this case, a strong lateral electric field exists between the channel of the turned-off memory cell MC27 and the local channels adjacent to the channel of the turned-off memory cell MC27. Accordingly, due to leakage current in the turned-off memory cell MC27, electrons transfer toward the local channel through the adjacent memory cell MC26 or MC28. In the memory cells at both sides of the turned-off memory cell MC27 (for example, the memory cells MC26 and MC28), a strong longitudinal electric field toward the floating gate FG is formed by the first pass voltage Vpass1 or the second pass voltage Vpass2. In this case, hot carrier injection may occur, where the transferred electrons are passed through a gate dielectric layer of the memory cell MC26 or MC28 and injected into the floating gate FG of the memory cell MC26 or MC28.

According to the first exemplary embodiment, in addressing such features of the conventional nonvolatile memory device, voltages lower than the first and second pass voltages Vpass1 and Vpass2 but higher than the isolation voltage Viso (that is, the first and second middle voltage Vmid1 and Vmid2) may be applied to the memory cells MC26 and MC28 adjacent to the turned-off memory cell MC27.

In using such a configuration, the boosting of the channel voltage of the memory cells MC26 and MC28 receiving the first and second middle voltage Vmid1 and Vmid2, respectively, is lower than that of the channel voltage of the memory cells receiving the first and second pass voltages Vpass1 and Vpass2 (for example, the memory cells MC25 and MC29). Therefore, a difference between the channel voltage of the memory cell MC27 and the channel voltage of the memory cells MC26 and MC28 decreases, and a difference between the channel voltage of the memory cells MC26 and MC28 and the channel voltage of the memory cells MC25 and MC29 adjacent to the memory cells MC26 and MC28, respectively, decreases. As a result, since the channel voltages between the turned-off memory cell and the adjacent memory cells decreases in each stage, hot carrier injection caused by a rapid change of the channel voltage between the memory cells may be prevented. Such preventive effect is described in more detail as follows.

Figure 2A:
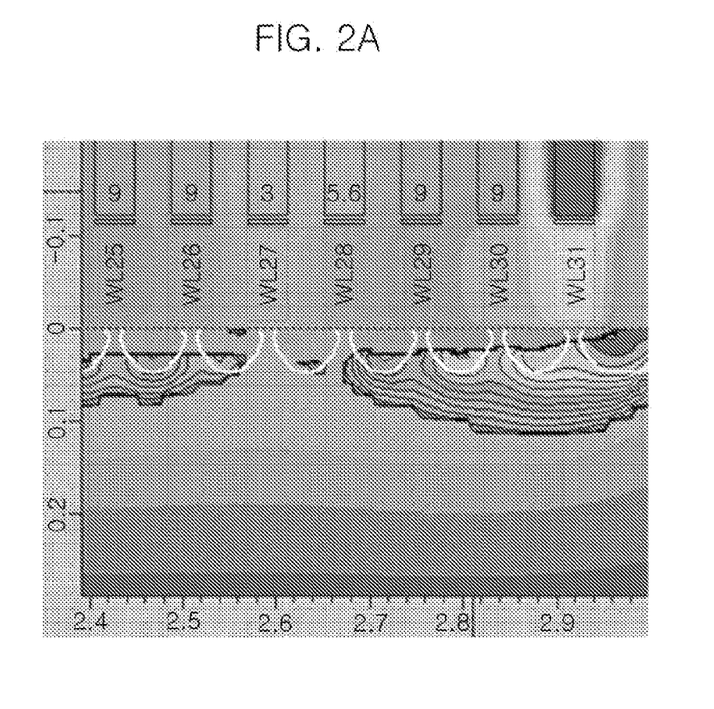
FIGS. 2A to 2D are diagrams illustrating an effect of the program method of the nonvolatile memory device in accordance with the first exemplary embodiment of the present invention.
Figure 2B:
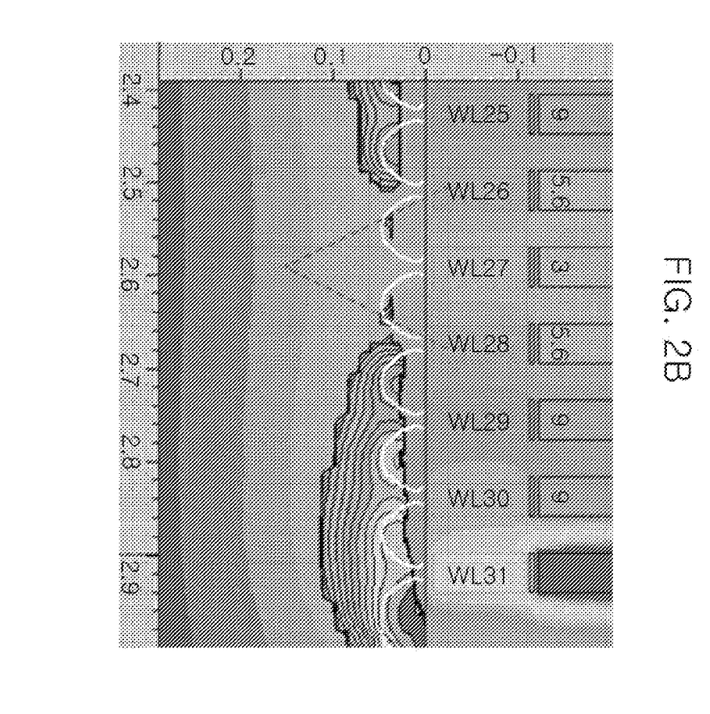
Figure 2C:
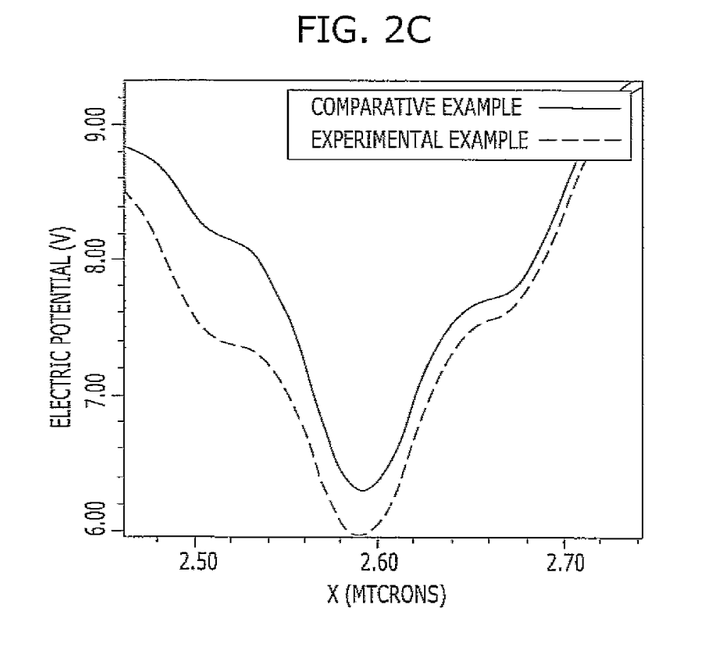
Figure 2D:
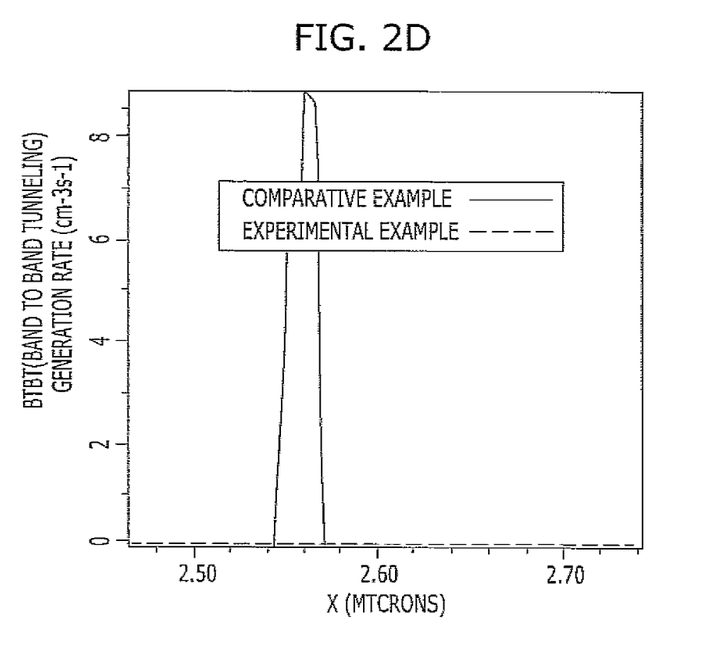

FIGS. 2A to 2D are diagrams illustrating an effect of the program method of the nonvolatile memory device in accordance with the first exemplary embodiment of the present invention. FIG. 2A is a diagram showing a potential contour developed in response to voltages applied to word lines. FIG. 2B is a diagram showing a potential contour developed in response to voltages applied to word lines. FIG. 2C is a graph showing channel potentials in the comparative example and the experimental example. FIG. 2D is a graph showing the occurrence of leakage current in the comparative example and the experimental example.

In the comparative example, a middle voltage of 5.6V is applied only to the word line WL28 adjacent to one side of the word line WL27 receiving an isolation voltage of 3V, a pass voltage of 9V is applied to the other unselected word lines, and a program voltage is applied to the selected word line WL31. On the other hand, in the experimental example, a middle voltage of 5.6V is applied to the adjacent word lines WL26 and WL28 on either sides of the word line WL27 receiving an isolation voltage of 3V, a pass voltage of 9V is applied to the other unselected word lines, and a program voltage is applied to the selected word line WL31.

For FIGS. 2A and 2B, the memory cell coupled to the word line WL27 receiving the isolation voltage of 3V is substantially turned off. Further, when the middle voltage of 5.6V is applied to the word lines WL26 and WL28 at either sides of the word line WL27, the channel potentials at either sides of the memory cell coupled to the word line WL27 gradually increase. For illustration purposes, more red a region in the drawings is, the potential thereof is higher, and more blue a region is, the potential thereof is lower.

In FIG. 2C, in the comparative example, the channel potentials at either sides of the word line WL27 are asymmetrical, but in the experimental example, the channel potential at either sides of the word line WL27 are substantially symmetrical.

Referring to FIG. 2D, it can be seen that, in the comparative example, leakage current between the word lines WL26 and WL27 occurs, but in the experimental example, leakage current does not occur.

In short, it can be seen from FIGS. 2A to 2D that, when the middle voltage lower than the pass voltage is applied to the word lines at either sides of the word line receiving the isolation voltage, an appropriate channel potential distribution is obtained, and the electron transfer through leakage current does not occur. Accordingly, hot carrier injection is substantially prevented.

Figure 3:
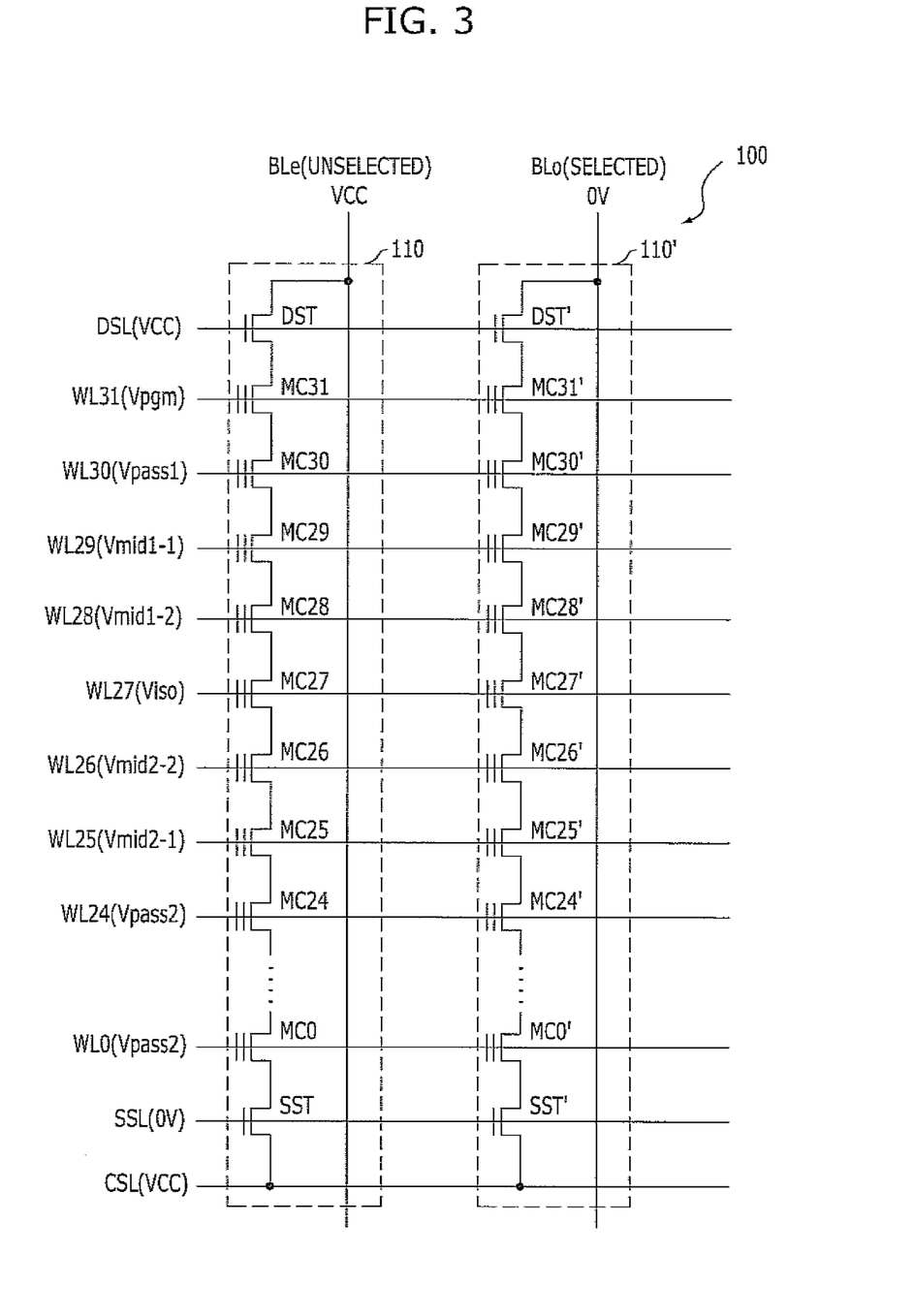
FIG. 3 is a circuit diagram illustrating a program method of a nonvolatile memory device in accordance with a second exemplary embodiment of the present invention.

FIG. 3 is a circuit diagram illustrating a program method of a nonvolatile memory device in accordance with a second exemplary embodiment of the present invention. For illustration purposes, description of features that are the same as those of the first exemplary embodiment of the present invention is omitted to a large extent while differences between the two embodiments are pointed out.

In the first exemplary embodiment, a word line WL28 receiving the first middle voltage Vmid1 and a word line WL26 receiving the second middle voltage Vmid2 are illustrated to be disposed between the word line WL27 receiving the isolation voltage Visa and the word line WL29 receiving the first pass voltage Vpass1 and between the word line WL27 receiving isolation voltage Visa and the word line WL25 receiving the second pass voltage Vpass2, respectively. Further, two word lines WL29 and WL30 receiving the first pass voltage Vpass1 are illustrated to be additionally disposed between the word line WL27 receiving the isolation voltage Viso and the word line WL31 receiving the program voltage Vpgm.

However, exemplary embodiments of the present invention are not limited to the above-illustrated specific features. For example, a plurality of word lines may receive the first middle voltage Vmid1, where the first middle voltage Vmid1 applied to different word lines may have different voltage levels between the first pass voltage Vpass1 and the isolation voltage Viso. Here, a lower one of the first middle voltage Vmid1 may be applied to a word line closer to the word line receiving the isolation voltage Visa, and a higher one of the first middle voltage Vmid1 may be applied to a word line more remote from the word line receiving the isolation voltage Viso. Here, the number of word lines receiving the second middle voltage Vmid2 and the number of the second middle voltage Vmid2 may also be varied. Further, the number of word lines that receive the first pass voltage and are disposed between the word line receiving the isolation voltage Viso and the word line receiving the program voltage Vpgm may vary. Such features of the exemplary embodiments of the present invention are described more specifically in relation to FIG. 3 as follows.

In FIG. 3, two word lines WL28 and WL29 are disposed between a word line WL27 receiving the isolation voltage Viso and a word line WL30 receiving the first pass voltage Vpass1, and a first middle voltage Vmid1-1 having a first level and a first middle voltage Vmid1-2 having a second level may be applied to the two word lines WL28 and WL29, respectively. The first middle voltage Vmid1-1 having the first level and the first middle voltage Vmid1-2 having the second level may differ from each other, where the first middle voltage Vmid1-1 having the first level may be larger than the first middle voltage Vmid1-2 having the second level.

Further, two word lines WL25 and WL26 may be disposed between the word line WL27 receiving the isolation voltage Viso and a word line WL24 receiving the second pass voltage Vpass2, and a second middle voltage Vmid2-1 having a first level and a second middle voltage Vmid2-2 having a second level may be applied to the two word lines WL25 and WL26, respectively. Here, the second middle voltage Vmid2-1 having the first level and the second middle voltage Vmid2-2 having the second level may differ from each other, where the second middle voltage Vmid2-1 having the first level may be larger than the second middle voltage Vmid2-2 having the second level.

The levels of middle voltages applied to word lines at symmetrical positions with respect to the word line WL27 receiving the isolation voltage Viso may be equal to each other. That is, the first middle voltage Vmid1-1 having the first level and the second middle voltage Vmid2-1 having the first level may be equal to each other, and the first middle voltage Vmid1-2 having the second level and the second middle voltage Vmid2-2 having the second level may be equal to each other.

Figure 4:
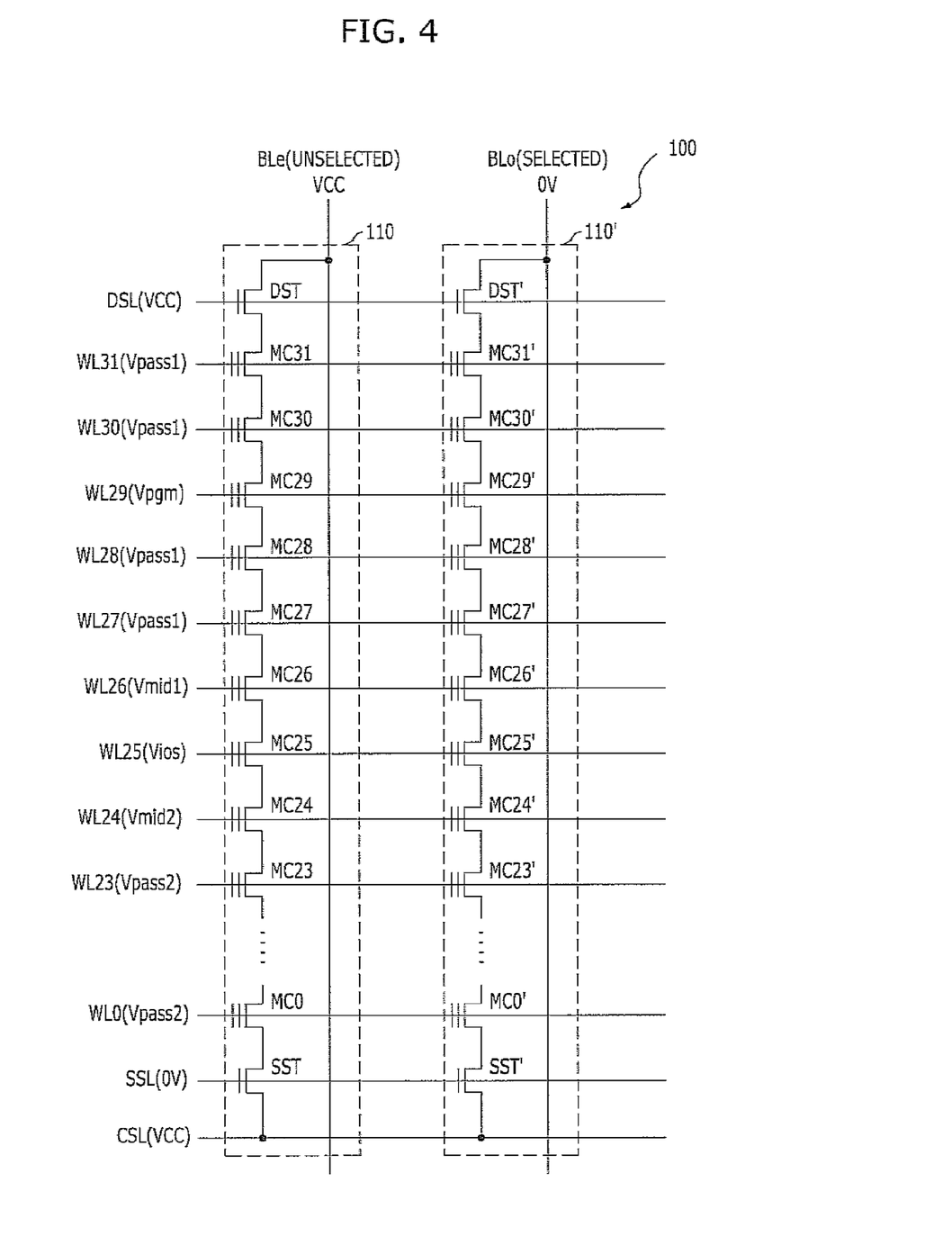
FIG. 4 is a circuit diagram illustrating a program method of a nonvolatile memory device in accordance with a third exemplary embodiment of the present invention.

FIG. 4 is a circuit diagram illustrating a program method of a nonvolatile memory device in accordance with a third exemplary embodiment of the present invention. For illustration purposes, description of features that are the same as those of the first exemplary embodiment of the present invention is omitted to a large extent while differences between the two embodiments are pointed out.

In the first exemplary embodiment, the word line WL31 receiving the program voltage Vpgm is illustrated to be the closest word line to a drain selection transistor DST coupled to the drain selection line DSL.

However, exemplary embodiments of the present invention are not limited to the above-illustrated specific features of the first exemplary embodiment. For example, the program voltage Vpgm may also be applied to any of the other word lines WL0 to WL30 and may be sequentially applied to the word lines WL0 to WL31. While a word line receiving the program voltage Vpgm may be different from the word line WL31, the same descriptions given above with respect to the first or second exemplary embodiment of the present invention may be applied to the third exemplary embodiment of the present invention, except that a voltage application scheme that shifts applied voltages to word lines downward in order to allow an application of a pass voltage to one or more word lines closest to the drain selection line DSL is used. Such features of the exemplary embodiments of the present invention are described more specifically in relation to FIG. 4 as follows.

In FIG. 4, the word line receiving the program voltage Vpgm may be a word line WL29 according to an example. In this case, the first pass voltage Vpass1 may be applied to word lines WL30 and WL31 disposed between the word line WL29 receiving the program voltage Vpgm and the drain selection line DSL. Further, two word lines WL27 and WL28 receiving the first pass voltage Vpass1 and a word line WL26 receiving the first middle voltage Vmid1 may be disposed between the word line WL29 receiving the program voltage Vpgm and a word line WL25 receiving the isolation voltage Viso, and a word line WL24 receiving the second middle voltage Vmid2 may be disposed between the word line WL25 to which the isolation voltage Viso is applied and word lines WL0 to WL23 receiving the second pass voltage Vpass2. This configuration is similar to that of the first exemplary embodiment of the present invention.

Meanwhile, in comparing the first exemplary embodiment with the third exemplary embodiment, the area of the local channel for the memory cell receiving the program voltage Vpgm in a cell string (for example, the cell string 100 coupled to the unselected bit line BLe) in the first exemplary embodiment is smaller than that in the third exemplary embodiment. More specifically, as the selected word line is closer to the drain selection line, the area of the local channel for the memory cell coupled to the selected word line is less. Here, as the local channel area becomes less, the boosting of the channel voltage increases. Therefore, as the selected word line is closer to the drain selection line (that is, as the local channel area decreases), a potential difference between the local channel for the memory cell coupled to the selected word line and another local channel isolated from the local channel increases. In this case, the probability of hot carrier injection caused by leakage current increases.

To address such features in the first to third exemplary embodiments of the present invention, the magnitude of the isolation voltage Viso may be increased as the selected word line is closer to the drain selection line. For example, while the isolation voltage Viso of 3V is applied in the first exemplary embodiment, a voltage of about 2.8V may be applied as the isolation voltage Viso in the third exemplary embodiment where the selected word line is farther away from the drain selection line as compared to the first exemplary embodiment. As long as the off state of a memory cell receiving the isolation voltage is maintained, a difference between the channel voltage of the memory cell receiving the isolation voltage Viso and the channel voltage of the memory cell receiving the middle voltage Vmid1 or Vmid2 decreases in response to an increase in the isolation voltage. Therefore, hot carrier injection caused by leakage current is prevented.

In the first to third exemplary embodiments of the present invention, while 32 word lines have been illustrated, the number may vary depending on the different environments in which the exemplary embodiments are applied. Here, as the number of word lines increases (that is, as the number of memory cells belonging to a cell string increases), the above-described features become more pronounced. That is, as the selected word line is closer to the drain selection line, the potential difference between the local channel for the memory cell coupled to the selected word line and a local channel isolated from the local channel increases, and the probability of hot carrier injection caused by leakage current increases. For example, experiments show that when the number of word lines is set to 64, the hot carrier injection caused by leakage current occurs more extensively in comparison to a case where the number of word lines is set to 32 as the selected word line becomes closer to the drain selection line.

To address such features, the magnitude of the isolation voltage Viso may increase as the number of word lines increases. For example, a voltage of 3V may be applied as the isolation voltage Viso in the first exemplary embodiment. In this case, when the number of word lines is 64 and the program voltage is applied to a 64-th word line which is the closest to the drain selection line, a voltage of 3.2V may be applied as the isolation voltage Viso.

According to the exemplary embodiments of the present invention, one or more middle voltages higher than an isolation voltage but lower than a pass voltage are applied to one or more memory cells at either sides of the memory cell that receive the isolation voltage and isolate a local channel from another local channel in a cell string including the program inhibit memory cell. Thus, a rapid change in the channel voltage between memory cells is substantially prevented. Here, when middle voltages are symmetrically applied to memory cells on either sides of the memory cell receiving the isolation voltage, the configuration of the voltage generation circuit for supplying voltages to the memory cells may be simplified. Further, by controlling the isolation voltage according to relative positions of word lines with respect to a drain selection line or the total number of word lines, hot carrier injection may be substantially prevented.

In accordance with the exemplary embodiments of the present invention, hot carrier injection caused by a channel voltage difference between memory cells may be prevented/reduced and a program inhibition operation may be performed according to the local self-boosting scheme.

While the present invention has been described with respect to the specific embodiments, it will be apparent to those skilled in the art that various changes and modifications may be made without departing from the spirit and scope of the invention as defined in the following claims.

What is claimed is:

1. A program method of a nonvolatile memory device including a memory cell array with a plurality of word lines located between a drain selection line and a source selection line, the program method comprising:
    applying a program voltage to a selected word line;
    applying a first pass voltage to at least one word line adjacent to the selected word line;
    applying at least one first middle voltage lower than the first pass voltage but higher than an isolation voltage to at least one word line adjacent to the word line receiving the first pass voltage;
    applying the isolation voltage to a word line adjacent to the word line receiving the first middle voltage;
    applying at least one second middle voltage higher than the isolation voltage but lower than a second pass voltage to at least one word line adjacent to the word line receiving the isolation voltage; and
    applying the second pass voltage to at least one word line adjacent to the word line receiving the second middle voltage.

2. The program method of claim 1, wherein the first middle voltage and the second middle voltage are equal to each other.

3. The program method of claim 1, wherein the at least one word line receiving the at least one first middle voltage includes at least two word lines,
    the at least one first middle voltage includes a plurality of first middle voltages, and
    a lower voltage of the first middle voltages is applied to a closer one of the at least two word lines to the word line receiving the isolation voltage and a higher voltage of the first middle voltages is applied to a more remote one of the at least two word lines from the word line receiving the isolation voltage.

4. The program method of claim 3, wherein the at least one word line receiving the at least one second middle voltage includes at least two word lines,
    the at least one second middle voltage includes a plurality of second middle voltages, and
    a lower voltage of the second middle voltages is applied to a closer one of the at least two word lines to the word line receiving the isolation voltage and a higher voltage of the second middle voltages is applied to a more remote one of the at least two word lines from the word line receiving the isolation voltage.

5. The program method of claim 4, wherein the number of the at least one word line receiving the at least one first middle voltage is equal to the number of the at least one word line receiving the at least one second middle voltage, and
    a first one of the first middle voltages applied to a first one of the at least one word line receiving the at least one first middle voltage is applied is the same as a first one of the second middle voltages applied to a first one of the at least one word lines that receives the at least one second middle voltage and the first one of the at least one word line receiving the at least one first middle voltage and the first one of the at least one word line receiving the at least one second middle voltage are symmetrically located with respect the word line receiving the isolation voltage.

6. The program method of claim 1, wherein, as the selected word line becomes closer to the drain selection line, the applied isolation voltage becomes larger.

7. The program method of claim 1, wherein, as the number of the plurality of word lines becomes larger, the applied isolation voltage becomes larger.

8. A program method of a nonvolatile memory device including a plurality of cell strings that each have a plurality of memory cells coupled in series between a drain selection transistor and a source selection transistor, the program method comprising:
    applying a program voltage to a control gate of a memory cell of a first cell string;
    applying a first pass voltage to a control gate of at least one memory cell adjacent to the memory cell receiving the program voltage, wherein the first pass voltage turns on the at least one memory cell adjacent to the memory cell receiving the program voltage;
    applying at least one first middle voltage lower than the first pass voltage but higher than an isolation voltage to a control gate of at least one memory cell adjacent to the memory cell receiving the first pass voltage;
    applying the isolation voltage to a control gate of at least one memory cell adjacent to the memory cell receiving the first middle voltage, wherein the isolation voltage turns off the at least one memory cell adjacent to the memory cell receiving the first middle voltage;
    applying at least one second middle voltage higher than the isolation voltage but lower than a second pass voltage to a control gate of at least one memory cell adjacent to the memory cell receiving the isolation voltage; and
    applying the second pass voltage to a control gate of at least one memory cell adjacent to the memory cell receiving the second middle voltage.

9. The program method of claim 8, wherein the first cell string comprises a program-inhibited cell string.

10. The program method of claim 8, wherein the first middle voltage and the second middle voltage are equal to each other.

11. The program method of claim 8, wherein the at least one memory cell receiving the at least one first middle voltage includes at least two memory cells,
    the at least one first middle voltage includes a plurality of first middle voltages, and
    a lower voltage of the first middle voltages is applied to a closer one of the at least two memory cells to the memory cell receiving the isolation voltage and a higher voltage of the first middle voltages is applied to a more remote one of the at least two memory cells from the memory cell receiving the isolation voltage.

12. The program method of claim 11, wherein the at least one memory cell receiving the at least one second middle voltage includes at least two memory cells,
    the at least one second middle voltage includes a plurality of second middle voltages, and
    a lower voltage of the second middle voltages is applied to a closer one of the at least two memory cells to the memory cell receiving the isolation voltage and a higher one of the second middle voltages is applied to a more remote one of the at least two memory cells from the memory cell receiving the isolation voltage.

13. The program method of claim 12, wherein the number of the at least one memory cell receiving the first middle voltage is equal to the number of the at least one memory cell receiving the second middle voltage, and a first one of the first middle voltages applied to a first one of the at least one memory cell receiving the at least one first middle voltage is the same as a first one of the second middle voltages applied to a first one of the at least one word lines receiving the at least one second middle voltage and the first one of the at least one memory cell receiving the at least one first middle voltage and the first one of the at least one word line receiving the at least one second middle voltage are symmetrically located with respect the memory cell receiving the isolation voltage.

14. The program method of claim 8, wherein, as the selected memory cell becomes closer to the drain selection transistor, the applied isolation voltage becomes larger.

15. The program method of claim 8, wherein, as the number of the plurality of word lines becomes larger, the applied isolation voltage becomes larger.

16. A method for programming a nonvolatile device comprising:

applying a program voltage to a selected word line for a memory string;

applying an isolation voltage to another word line for the memory string, wherein a memory cell of the memory string receives the isolation voltage and is turned off in response to the isolation voltage regardless of whether the memory cell is programmed;

applying at least one first pass voltage to at least one first word line located between the selected word line and the word line receiving the isolation voltage, wherein at least one memory cell of the memory string receives the at least one first pass voltage and is turned on in response to the at least one first pass voltage regardless of whether the at least one memory cell receiving the at least one first pass voltage is programmed; and applying at least one middle voltage to at least one second word line located between the at least one first word line and the word line receiving the isolation voltage, wherein the at least one middle voltage is lower than the at least one first pass voltage but higher than the isolation voltage.

17. The method of claim 16, wherein the at least one middle voltage includes a first middle voltage applied to a first one of the at least one second word line and a second middle voltage lower than the first middle voltage is applied to a second one of the at least one second word line located between the first one of the at least one second word line and the word line receiving the isolation voltage.

18. The method of claim 16, wherein the at least one first pass voltage and the at least one middle voltage are applied symmetrically to both sides of the memory string with respect to the memory cell receiving the isolation voltage.

19. The method of claim 16, wherein, as the selected word line becomes closer to a drain selection line coupled to a memory cell located between memory cells and a bit line for the memory string, the applied isolation voltage becomes larger.

20. The method of claim 16, wherein, as the total number of word lines for the memory string becomes larger, the applied isolation voltage becomes larger.

* * * * *